(12) United States Patent
He

(10) Patent No.: US 11,039,006 B2
(45) Date of Patent: Jun. 15, 2021

(54) DISPLAY PANEL MODULE AND ELECTRONIC DEVICE

(71) Applicant: Huawei Technologies Co., Ltd., Shenzhen (CN)

(72) Inventor: Hu He, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/652,474

(22) PCT Filed: Nov. 2, 2017

(86) PCT No.: PCT/CN2017/109163
§ 371 (c)(1),
(2) Date: Mar. 31, 2020

(87) PCT Pub. No.: WO2019/071671
PCT Pub. Date: Apr. 18, 2019

(65) Prior Publication Data
US 2020/0236213 A1    Jul. 23, 2020

(30) Foreign Application Priority Data

Oct. 9, 2017  (CN) .......................... 201710929973.7

(51) Int. Cl.
*G09G 5/00*  (2006.01)
*H04M 1/72469*  (2021.01)
(Continued)

(52) U.S. Cl.
CPC ...... *H04M 1/72469* (2021.01); *G06F 3/0482* (2013.01); *G06F 3/04817* (2013.01); *H04W 4/60* (2018.02)

(58) Field of Classification Search
CPC ...... G02F 1/1333; G06F 1/1637; G06F 3/041; G06F 3/04817; G06F 3/0482;
(Continued)

(56) References Cited

U.S. PATENT DOCUMENTS

2008/0180585 A1   7/2008 Kubota et al.
2012/0319967 A1  12/2012 Tsai et al.
(Continued)

FOREIGN PATENT DOCUMENTS

CN    102566837 A    7/2012
CN    102833944 A    12/2012
(Continued)

*Primary Examiner* — Insa Sadio
(74) *Attorney, Agent, or Firm* — Conley Rose, P.C.

(57) ABSTRACT

A display panel module includes an organic light-emitting diode panel (OLED), a touch panel, and a bifurcated chip on film (COF). An OLED panel connection area is disposed at a first location on a first side of the OLED panel, and a touch panel connection area is disposed at a first location on a first side of the touch panel. The OLED panel connection area and the touch panel connection area are located at a same side of the display panel module. One bifurcated terminal of the bifurcated COF is connected to the OLED panel connection area, and the other bifurcated terminal of the bifurcated end of the bifurcated COF is connected to the touch panel connection area. The other end of the bifurcated COF is connected to a main flexible printed circuit. A chip of the bifurcated chip on film COF is a touch and display driver chip.

17 Claims, 13 Drawing Sheets

(51) Int. Cl.
*H04W 4/60* (2018.01)
*G06F 3/0481* (2013.01)
*G06F 3/0482* (2013.01)

(58) Field of Classification Search
CPC . H04M 1/0277; H04M 1/72583; H04W 4/60; H05K 1/147
See application file for complete search history.

(56) References Cited

U.S. PATENT DOCUMENTS

| | | | |
|---|---|---|---|
| 2013/0162506 A1* | 6/2013 | Kim | G09F 13/0413 345/82 |
| 2015/0279263 A1* | 10/2015 | Lim | G09G 3/2092 345/214 |
| 2017/0301884 A1 | 10/2017 | Li | |
| 2018/0046322 A1 | 2/2018 | Li et al. | |

FOREIGN PATENT DOCUMENTS

| | | |
|---|---|---|
| CN | 104731414 A | 6/2015 |
| CN | 104992956 A | 10/2015 |
| CN | 105630244 A | 6/2016 |
| CN | 106155370 A | 11/2016 |
| CN | 106293233 A | 1/2017 |
| CN | 106504647 A | 3/2017 |
| CN | 106526925 A | 3/2017 |
| JP | 2005038231 A | 2/2005 |
| KR | 20050032894 A | 4/2005 |

\* cited by examiner

DISPLAY PANEL MODULE AND ELECTRONIC DEVICE

CROSS-REFERENCE TO RELATED APPLICATIONS

This application is a National Stage of International Patent Application No. PCT/CN2017/109163 filed on Nov. 2, 2017, which claims priority to Chinese Patent Application No. 201710929973.7 filed on Oct. 9, 2017. Both of the aforementioned applications are hereby incorporated by reference in their entireties.

TECHNICAL FIELD

This Application Relates To The Field Of Electronic Products, And In Particular, To A Narrow Bezel Display Panel Module And An Electronic Device.

BACKGROUND

With the development of electronic products, such as mobile terminals, a product bezel becomes a key challenge, and how to reduce a bezel size of a display panel module has become an essential point.

An out-terminal (PIN) side bezel of an active matrix/organic light emitting diode (active matrix organic light emitting diode, AMOLED) panel is shown in FIG. 1A. The out-PIN side bezel is located at a lower part of the AMOLED panel, that is, the bottom of a mobile terminal. The out-PIN side bezel includes three parts of the panel: a signal wiring area, a chip on film (chip on film, COF) connection region, and a COF bending area, as shown in FIG. 1B. A cutting direction of the cross section shown in FIG. 1B is shown in FIG. 1C.

In a conventional display panel module, as shown in FIG. 1B, a touch panel (touch panel) is bonded to the organic light-emitting diode (organic light-emitting diode, OLED) panel by using an optically clear adhesive (optically clear adhesive, OCA). The touch panel and the OLED panel are both connected to a main FPC. The touch panel is connected to the main FPC by using a touch-control FPC, and the OLED panel is connected to the main FPC by using a COF. Seen from a configuration of the display panel module, the touch panel is disposed on an outer side of the OLED panel. In the COF bending area, the touch-control FPC is also bent on an outer side of the COF. Moreover, because a distance needs to be kept between the touch-control FPC and the COF to avoid problems such as interference between the touch-control FPC and the COF, the out-PIN side bezel is relatively wide.

SUMMARY

Embodiments of the present invention provide a display panel module and an electronic device. A touch panel connection area and an OLED panel are connected to a bifurcated COF, thereby reducing a width of an out-PIN side bezel of the display panel module.

According to a first aspect, a display panel module is provided. The display panel module may include an organic light-emitting diode OLED panel, a touch panel, and a bifurcated chip on film COF.

An OLED panel connection area is disposed at a first location on a first side of the OLED panel, a touch panel connection area is disposed at a first location on a first side of the touch panel, and the OLED panel connection area and the touch panel connection area are located at a same side of the display panel module. One bifurcated terminal of a bifurcated end of the bifurcated COF is connected to the OLED panel connection area, and the other bifurcated terminal of the bifurcated end of the bifurcated COF is connected to the touch panel connection area. The other end of the bifurcated COF is connected to a main flexible printed circuit FPC. A chip of the bifurcated chip on film COF is a touch and display driver chip.

With the display panel module, a width of an out-PIN side bezel is reduced, thereby improving user experience.

In a possible implementation, the first location on the first side of the OLED panel is a middle location on the first side of the OLED panel, and the first location on the first side of the touch panel is locations at two ends of the first side of the touch panel; or the first location on the first side of the OLED panel and the first location on the first side of the touch panel are respectively at two ends of a first side of the display panel module.

In another possible implementation, the OLED panel connection area is disposed at the first location on the first side of the OLED panel in a fan-like shape.

In a possible embodiment, a second location on the first side of the touch panel is disposed as an opening area, and a location of the OLED panel connection area is corresponding to the second location after the touch panel is bonded to the OLED panel, to expose the OLED panel connection area after the OLED panel is bonded to the touch panel.

In a possible embodiment, after the OLED panel is bonded to the touch panel, a distance D is kept between the OLED panel connection area and the touch panel connection area, to avoid signal interference between the touch panel and the OLED panel. The distance D is any value between 0.05 mm and 15 mm.

In a possible implementation, a width of the OLED panel connection area is W, and the width W is any value between 20 mm and 70 mm.

In a possible implementation, there is a height difference T between the OLED panel connection area and the touch panel connection area, and the height difference T is any value between 0.01 mm and 2 mm.

In a possible implementation, the bifurcated COF is a flexible circuit board to which the touch and display driver chip is bonded.

According to a second aspect, a manufacturing method of a display panel module is provided, and the method may include:

connecting an OLED panel connection area of an organic light-emitting diode OLED panel bonded to a touch panel to one bifurcated terminal of a bifurcated end of a bifurcated chip on film COF, and connecting a touch panel connection area of the touch panel to the other bifurcated terminal of the bifurcated end of the bifurcated COF;

connecting the other end of the bifurcated COF to a main flexible printed circuit FPC; and bending the bifurcated COF.

The OLED panel connection area is disposed at a first location on a first side of the OLED panel, the touch panel connection area is disposed at a first location on a first side of the touch panel, and the first side of the OLED panel and the first side of the touch panel are at a same side of the display panel module.

Connecting the bifurcated COF to the touch panel and the OLED panel reduces a width of an out-PIN side bezel of the display panel module, thereby improving user experience.

In a possible implementation, the first location on the first side of the OLED panel is a middle location on the first side of the OLED panel, and the first location on the first side of the touch panel is locations at two ends of the first side of the touch panel; or the first location on the first side of the OLED panel and the first location on the first side of the touch panel are respectively at two ends of the display panel module.

In another possible implementation, the OLED panel connection area is disposed at the first location on the first side of the OLED panel in a fan-like shape.

In a possible implementation, before the connecting an OLED panel connection area of an organic light-emitting diode OLED panel bonded to a touch panel to one bifurcated terminal of a bifurcated end of a bifurcated chip on film COF, and connecting a touch panel connection area of the touch panel to the other bifurcated terminal of the bifurcated end of the bifurcated COF, the method includes:

bonding the OLED panel to the touch panel, where the OLED panel connection area of the bonded OLED panel is exposed through an opening area, the opening area is disposed at a second location on the first side of the touch panel, and a location of the OLED panel connection area is corresponding to the second location after the touch panel is bonded to the OLED panel.

In a possible implementation, after the OLED panel is bonded to the touch panel, a distance D is kept between the OLED panel connection area and the touch panel connection area, to avoid signal interference between the touch panel and the OLED panel. The distance D is any value between 0.05 mm and 15 mm.

In a possible implementation, a width of the OLED panel connection area is W, and the width W is any value between 20 mm and 70 mm.

In a possible implementation, there is a height difference T between the OLED panel connection area and the touch panel connection area, and the height difference T is any value between 0.01 mm and 2 mm.

According to a third aspect, an electronic device is provided. The electronic device may include a display panel module and a processor. The display panel module includes an organic light-emitting diode OLED panel, a touch panel, and a bifurcated chip on film COF. An OLED panel connection area is disposed at a first location on a first side of the OLED panel, a touch panel connection area is disposed at a first location on a first side of the touch panel, and the OLED panel connection area and the touch panel connection area are located at a same side of the display panel module. One bifurcated terminal of a bifurcated end of the bifurcated COF is connected to the OLED panel connection area, and the other bifurcated terminal of the bifurcated end of the bifurcated COF is connected to the touch panel connection area. The other end of the bifurcated COF is connected to the processor by using a flexible circuit board. A chip of the bifurcated chip on film COF is a touch and display driver chip.

Optionally, in a possible implementation, the first location on the first side of the OLED panel is a middle location on the first side of the OLED panel, and the first location on the first side of the touch panel is locations at two ends of the first side of the touch panel; or the first location on the first side of the OLED panel and the first location on the first side of the touch panel are respectively at two ends of a first side of the display panel module.

Optionally, in a possible implementation, the OLED panel connection area is disposed at the first location on the first side of the OLED panel in a fan-like shape.

Optionally, in a possible implementation, a second location on the first side of the touch panel is disposed as an opening area, and a location of the OLED panel connection area is corresponding to the second location after the touch panel is bonded to the OLED panel, to expose the OLED panel connection area after the OLED panel is bonded to the touch panel.

Optionally, in a possible implementation, after the OLED panel is bonded to the touch panel, a distance D is kept between the OLED panel connection area and the touch panel connection area, to avoid signal interference between the touch panel and the OLED panel. The distance D is any value between 0.05 mm and 15 mm.

Optionally, in a possible implementation, a width of the OLED panel connection area is W, and the width W is any value between 20 mm and 70 mm.

Optionally, in a possible implementation, there is a height difference T between the OLED panel connection area and the touch panel connection area, and the height difference T is any value between 0.01 mm and 2 mm.

Optionally, in a possible implementation, the bifurcated COF is a flexible circuit board FPC to which the touch and display driver chip is bonded.

Optionally, in a possible implementation, the electronic device is a mobile phone or a wearable device.

Based on the display panel module and the electronic device provided in the embodiments of the present invention, the display panel and the OLED panel are connected to the bifurcated COF, thereby reducing a width of an out-PIN side bezel of the display panel module.

DESCRIPTION OF EMBODIMENTS

Embodiments of the present invention provide a display panel module and a manufacturing method thereof, and an electronic device, and are applicable to a display panel module with an OLED panel and an external touch panel bonded to each other.

In the embodiments of the present invention, the OLED panel may be bonded to the touch panel by using an OCA. The OLED panel and the touch panel are designed in a staggered pattern, and a bifurcated COF (Chip On Film, or Chip On Flex, COF for short, where COF represents chip on film) is used to connect the OLED panel and the touch panel, thereby reducing a width of an out-PIN side bezel of a terminal.

The following describes solutions of the embodiments of the present invention with reference to accompanying drawings.

Figure 1A:
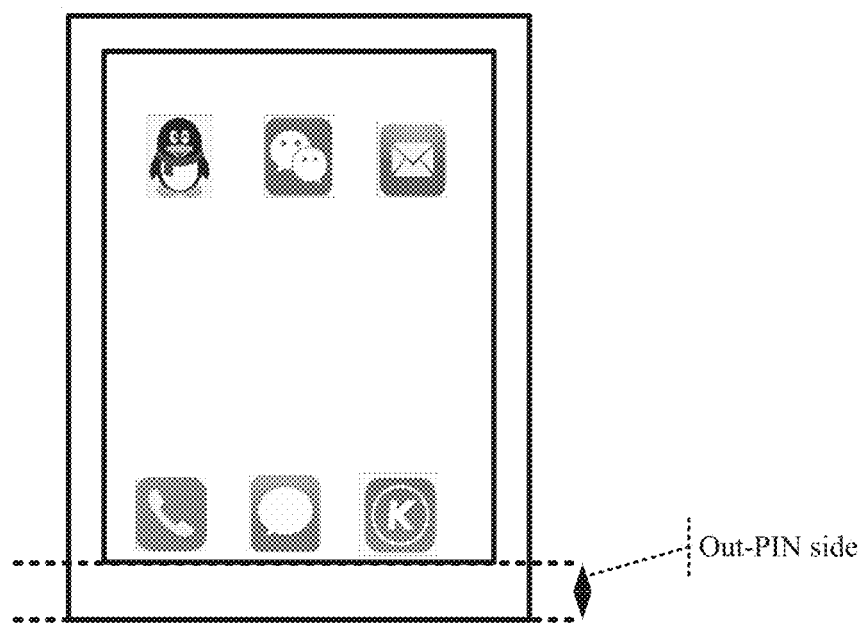
FIG. 1A is a schematic diagram of a location of an out-PIN side bezel in the prior art.
Figure 1B:
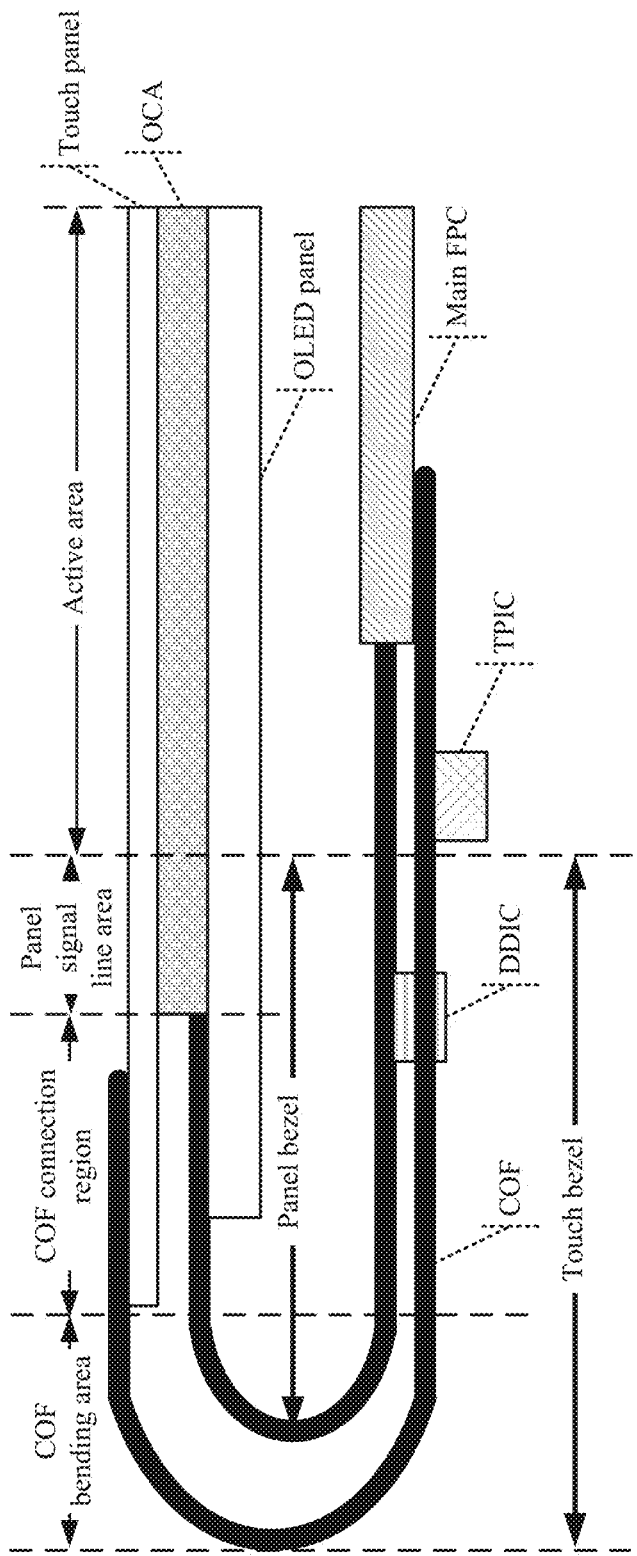
FIG. 1B is a schematic structural diagram of an out-PIN side bezel in the prior art.
Figure 1C:
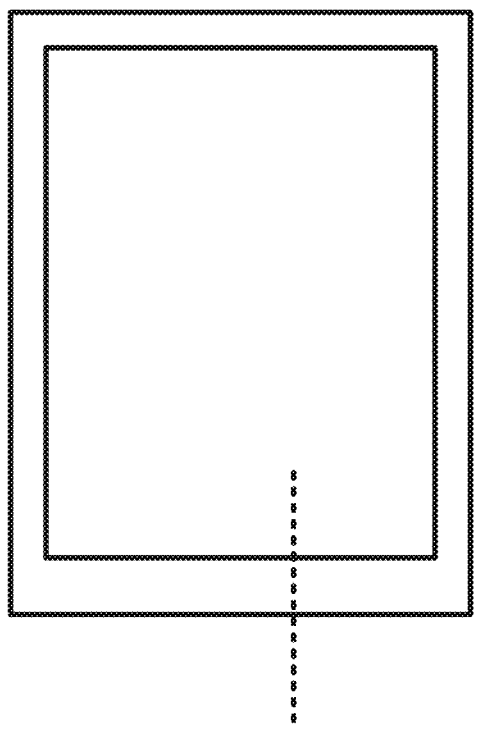
FIG. 1C is a schematic diagram of a cutting direction of a cross section shown in FIG. 1B.
Figure 2:
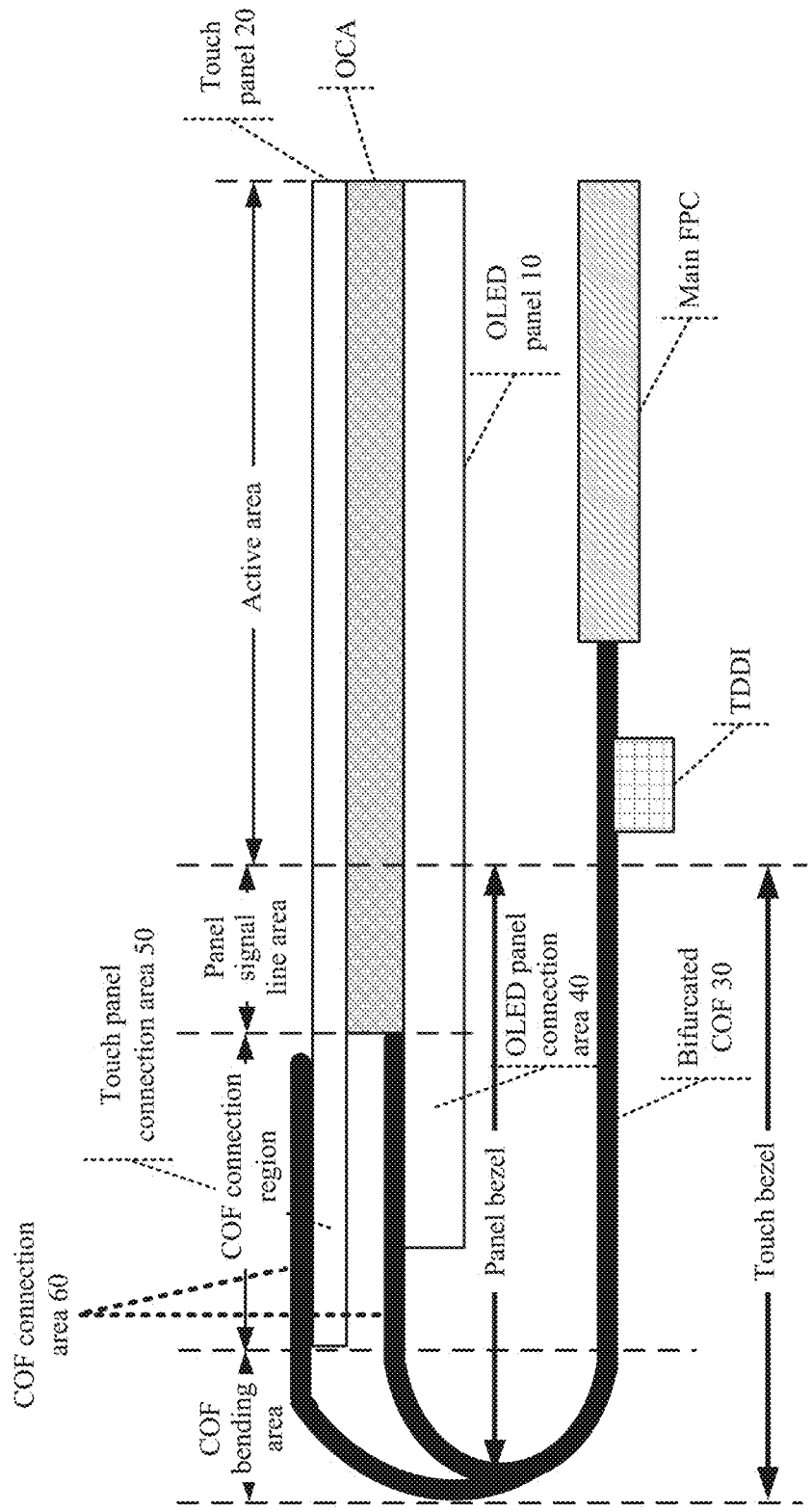
FIG. 2 is a schematic structural diagram of a cross section of an out-PIN side bezel of a display module according to an embodiment of the present invention.

FIG. 2 is a schematic diagram of a cross section of an out-PIN side bezel of a display panel module of a terminal, and a cutting direction is shown in FIG. 1C.

As shown in FIG. 2, the display panel module includes an active area (active area), a panel signal line area (panel signal line area), a COF connection region, and a COF bending area. A signal line of the active area is connected to a bifurcated chip on film COF in the COF connection region through the panel signal line area, and the bifurcated COF is bent in the COF bending area and is connected to a main flexible printed circuit (flexible printed circuit, FPC), thereby reducing a width of an out-PIN side bezel of a display panel.

A chip of the bifurcated chip on film COF is a touch and display driver chip (touch and display driver integration, TDDI). The touch and display driver chip includes a touch driver and a display driver, and the touch driver and the display driver are integrated as one piece. In addition, the bifurcated chip on film COF may be an FPC to which the touch and display driver chip is bonded.

The active area is an active area of a panel, and the panel includes an OLED panel 10 and a touch panel 20. The active area herein may be an active area of a display screen of the terminal, for example, a display screen of a mobile phone. Signal lines of all signals of the active area may be disposed in the panel signal line area. The panel signal line area is a bonding lead (bonding lead) area that connects all of the signal lines of the active area to the panel. The bonding lead area herein is included in the panel signal line area.

An OLED panel connection area 40 is disposed at an end of a side of the OLED panel 10; a touch panel connection area 50 is disposed at an end of a side of the touch panel 20; and the OLED panel connection area 40 and the touch panel connection area are disposed at a same side of the display panel module. The COF connection area 60 is disposed at a bifurcated end of the bifurcated COF 30. In this embodiment of this application, the COF connection area 60 may also be referred to as a bifurcated end. In the COF connection region, the OLED panel 10 is connected to one bifurcated terminal of the bifurcated end of the bifurcated COF 30 through the OLED panel connection area 40, and the touch panel 20 is connected to the other bifurcated terminal of the bifurcated end of the bifurcated COF 30 through the touch panel connection area 50. The bifurcated COF is shown in FIG. 2. The other end of the bifurcated COF 30 is connected to the main FPC.

A substrate of the bifurcated COF may be polyimide (Polyimide, PI). Because the PI can be bent, the bifurcated COF that connects the OLED panel and the touch panel is bent in the COF bending area, and finally connects the bonding lead on the panel and the main FPC.

The OLED panel is connected to the touch panel by using the bifurcated COF. In the COF bending area, bending of the bifurcated COF reduces a width of an out-PIN side bezel of the display panel module, thereby further improving user experience.

In this embodiment of the present invention, the OLED panel and the touch panel are designed in a staggered pattern. For details, refer to FIG. 4A and descriptions of FIG. 4A.

The TDDI is configured to control both a display function and a touch function of the display panel module. To be specific, the TDDI is configured to control a touch operation on the display panel module, process signals transmitted by an application processor (Application Processor, AP), and control each pixel on the display screen. The main FPC is configured to connect the OLED panel and the touch panel (that is, the display screen and a touchscreen) to a main board of the terminal. The main board of the terminal may be a PCB provided with an application processor.

In a conventional display panel module, a display panel integrated circuit (touch panel integrated circuit, TPIC) and a display driver integrated circuit (display driving integrated circuit, DDIC) are independently integrated on a COF, as shown in FIG. 1B, to separately control a touch operation on the display panel module, process signals transmitted by an AP, and control each pixel on a display screen. By comparison, the display panel module provided in this embodiment of the present invention can implement functions of the TPIC and the DDIC of the conventional display panel module by using only one integrated circuit, thereby reducing costs.

In this embodiment of the present invention, an end, of the AMOLED panel, at which the out-PIN side bezel of the AMOLED panel is located may be referred to as a first end of the display panel module. In the COF connection region of the out-PIN side bezel, an area in which the touch panel is connected to the bifurcated COF may be referred to as the touch panel connection area (bonding pad), and an area in which the OLED panel is connected to the bifurcated COF may be referred to as the OLED connection area (bonding pad). A corresponding area in which the bifurcated COF 30 is connected to the touch panel connection area 50 and the OLED panel connection area 40 may be referred to as the COF connection area (COF bonding pad). There are a large quantity of metal wires in the bonding pad, which are similar to connecting fingers (connecting finger). The OLED panel connection area and the touch panel connection area are disposed at an out-PIN bezel side of the display panel module.

The following describes a staggered-pattern design of an OLED panel and a touch panel, a design of a bifurcated COF, and a manner of connecting the bifurcated COF to the OLED panel and the touch panel, in a display panel module.

Figure 3A:
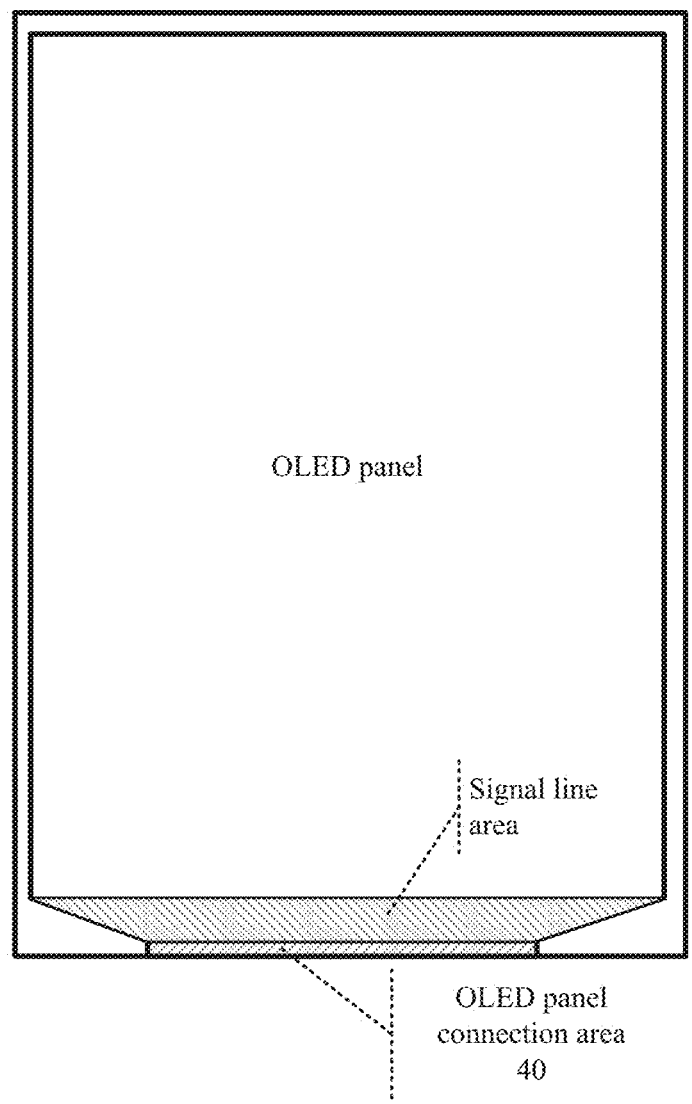
FIG. 3A is a schematic structural diagram of disposition of an OLED panel connection area according to an embodiment of the present invention.
Figure 3B:
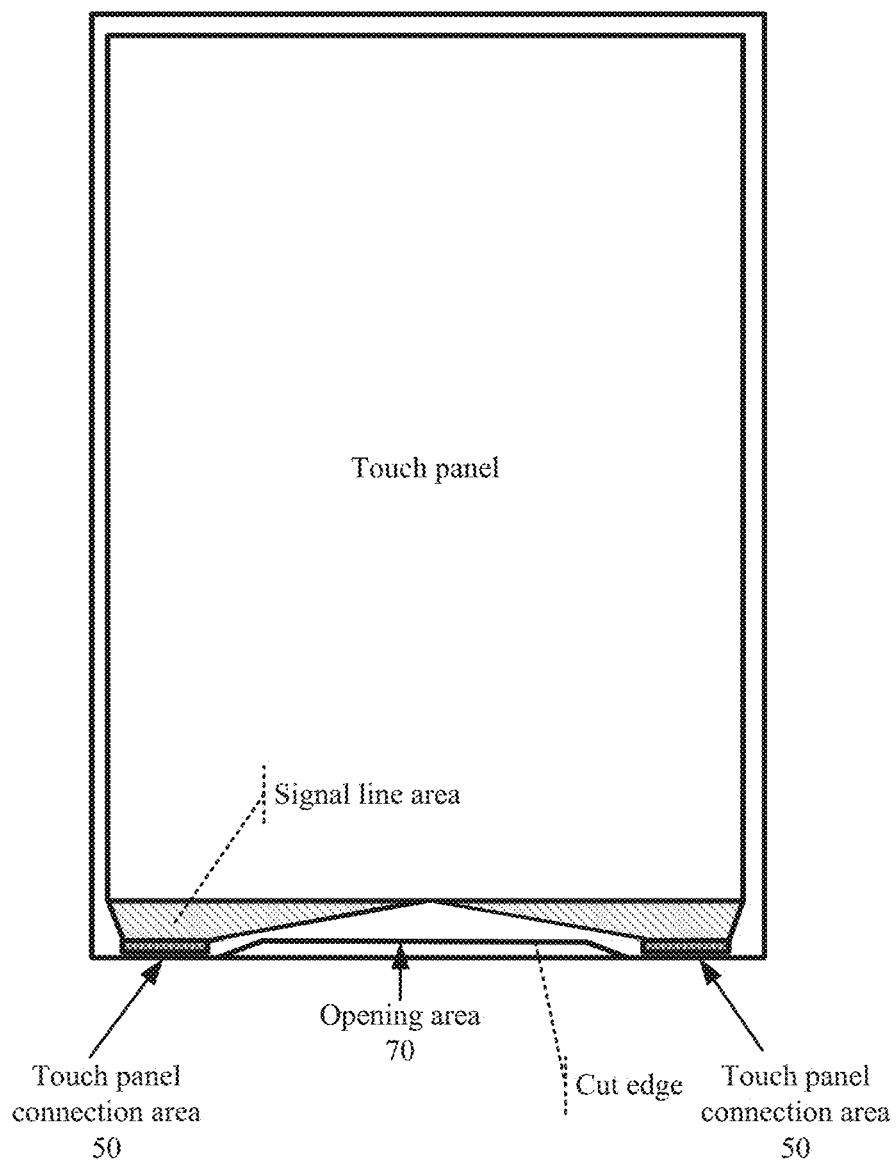
FIG. 3B is a schematic structural diagram of disposition of a touch panel connection area according to an embodiment of the present invention.
Figure 3C:
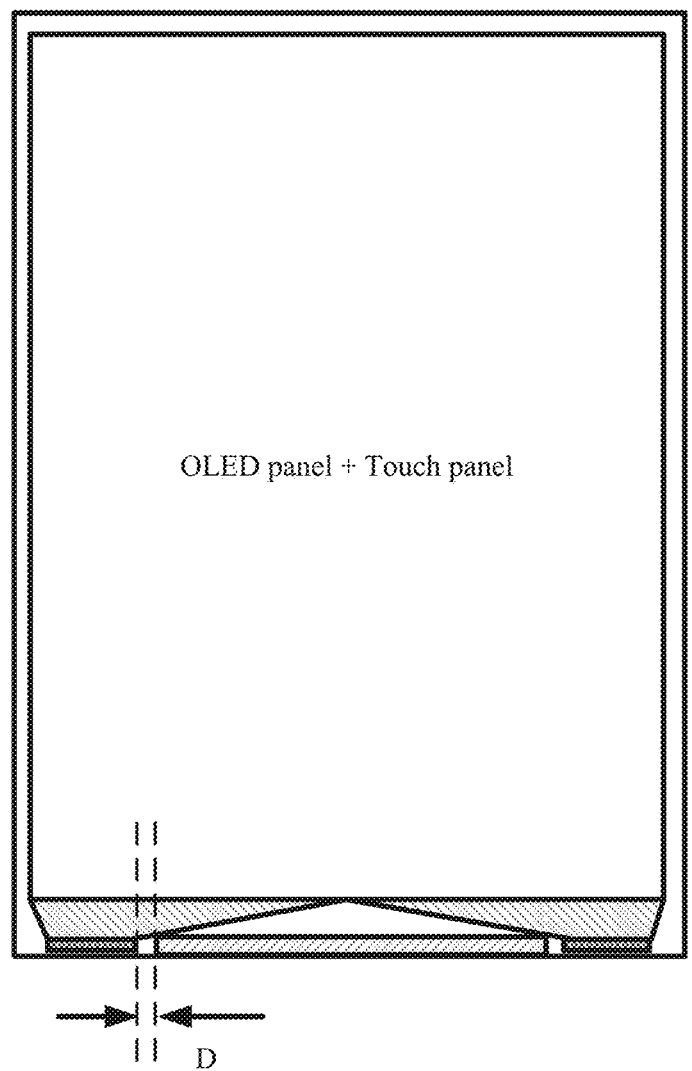
FIG. 3C is a schematic structural diagram after an OLED panel is bonded to a touch panel according to an embodiment of the present invention.

FIG. 3A is a schematic structural diagram of disposition of an OLED panel connection area according to an embodiment of the present invention. FIG. 3B is a schematic structural diagram of disposition of a touch panel connection area according to an embodiment of the present invention. FIG. 3C is a schematic structural diagram after a touch panel is bonded to an OLED panel according to an embodiment of the present invention.

Optionally, in an embodiment of the present invention, as shown in FIG. 3A, an OLED panel connection area 40 is narrowed in a fanout (fanout) manner through signal lines of an OLED panel 10, and is disposed at a middle location on an out-PIN side bezel. A width of the OLED panel connection area 40 may be W. A value of the width W may be determined based on factors such as a size of the OLED panel and/or a resolution of the OLED panel. The width W may be any value between 20 mm and 70 mm. As shown in FIG. 3B, a touch panel connection area 50 is disposed at two ends of the out-PIN side bezel through a signal line layout. There is no signal line layout area on an out-PIN side of the touch panel, and an area corresponding to the OLED panel connection area is disposed as an opening area 70, to expose the OLED panel connection area 40 after the touch panel 20 is bonded to the OLED panel 10, as shown in FIG. 3C. After the OLED panel 10 is bonded to the touch panel 20, the OLED panel connection area 40 may be exposed through the opening area 70 disposed on the touch panel, as shown in FIG. 3C. In addition, to avoid signal interference between the OLED panel 10 and the touch panel 20, after the bonded OLED panel 10 is bonded to the touch panel 20, there is a distance D between the OLED panel connection area 40 and the touch panel connection area 50. The distance D is any value between 0.05 mm and 15 mm. A value of the distance D may be determined based on factors such as a size of the OLED panel and/or a resolution of the OLED panel.

Figure 4A:
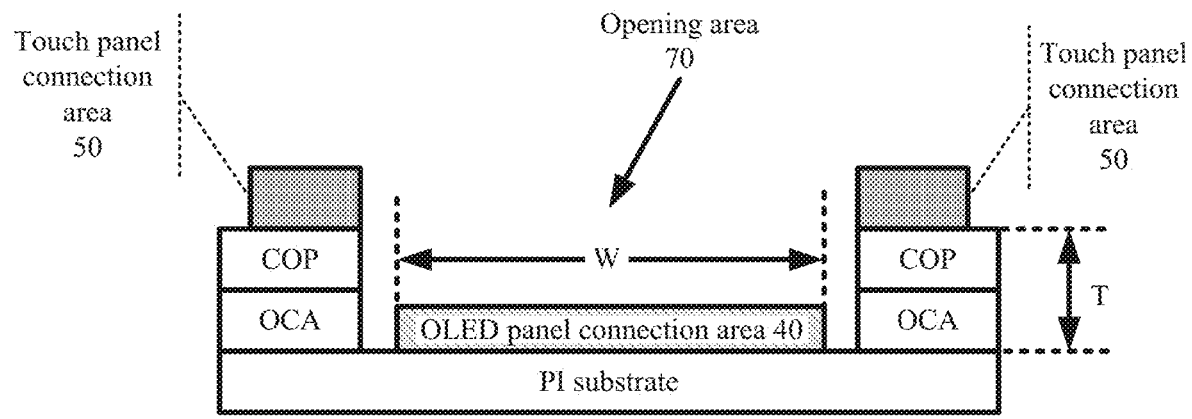
FIG. 4A is a schematic structural diagram of another cross section of an out-PIN side bezel of a display panel module according to an embodiment of the present invention.
Figure 4B:
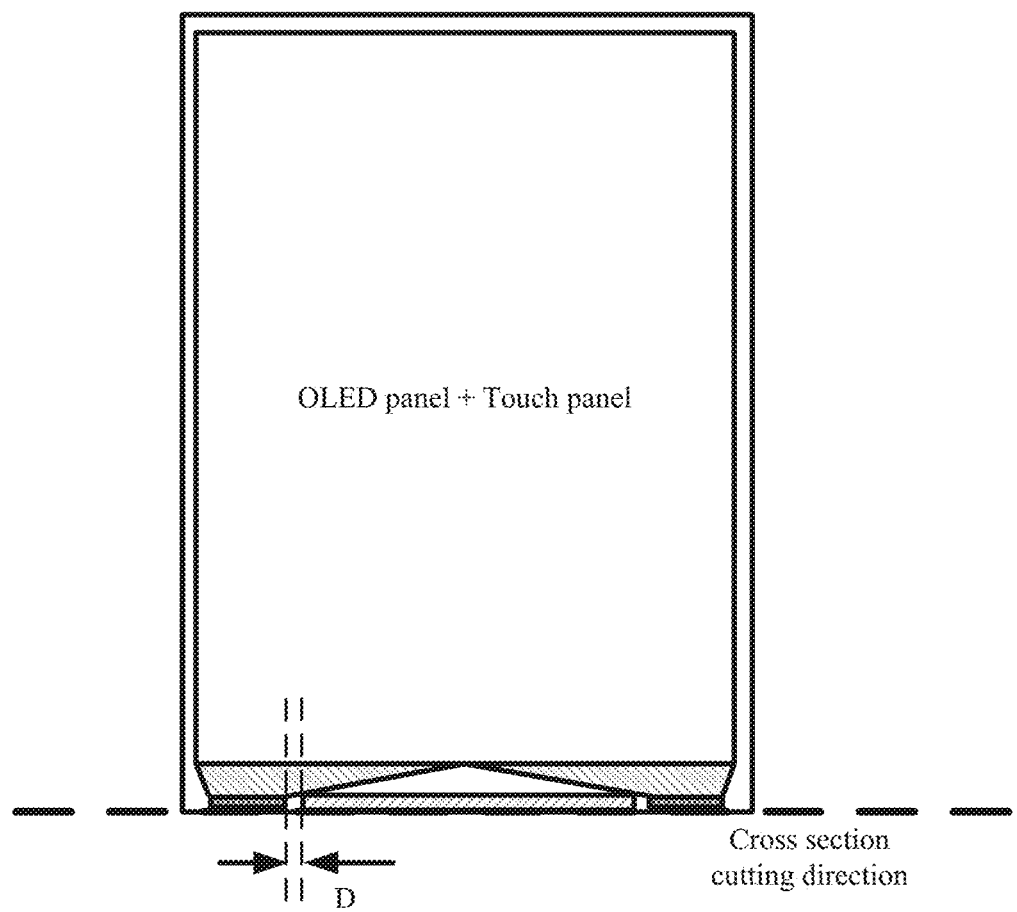
FIG. 4B is a schematic diagram of a cutting direction of a cross section shown in FIG. 4A.

In this embodiment of the present invention, after the OLED panel 10 is bonded to the touch panel 20, there is also a height difference T between the OLED panel 10 and the touch panel 20. In other words, there is a height difference T between the OLED panel connection area 40 and the touch panel connection area 50. For details, refer to FIG. 4A. The height difference T depends on a thickness of an OCA that bonds the OLED panel 10 to the touch panel 20. FIG. 4A is a schematic structural diagram of another cross section of a display panel module according to an embodiment of the present invention. FIG. 4B is a schematic diagram of a cutting direction of a cross section shown in FIG. 4A.

As shown in FIG. 4A, the height difference T between the OLED panel connection area 40 and the touch panel connection area 50 may also be affected by some other materials that make up the display panel module, for example, an OCA and a cyclo-olefin polymer (Cyclo-Olefin Polymer, COP).

Correspondingly, during disposition of a COF connection area, the COF connection area is disposed based on locations corresponding to the OLED panel connection area 40 and the touch panel connection area 50. A corresponding mark (mark) is set for a connection area corresponding to each section. In addition, a corresponding connection area width is kept, and the distance D is kept between the OLED panel connection area 40 and the touch panel connection area 50.

Keeping the distance D between the OLED connection area 40 and the touch panel connection area 50 has at least two advantages.

1. The OLED connection area 40 is separated from the touch panel connection area 50, to avoid signal interference.

Figure 5:
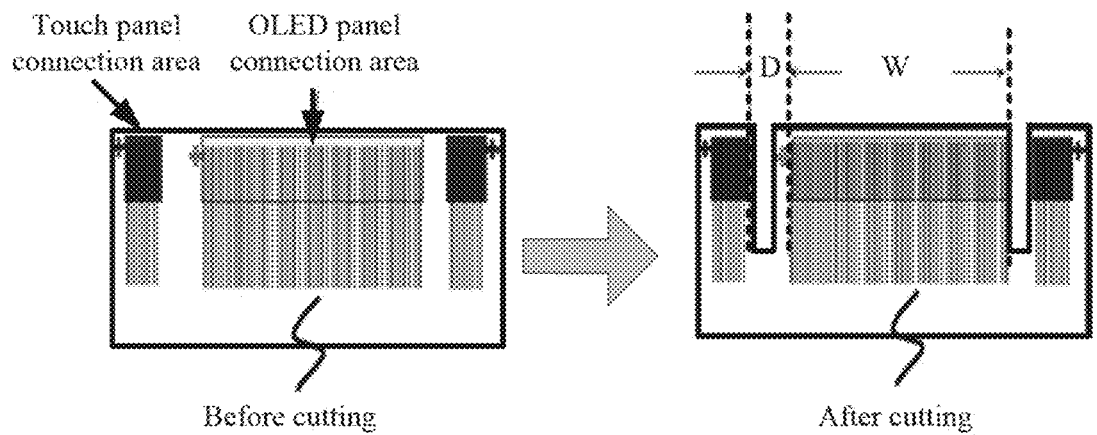
FIG. 5 is a schematic structural diagram before and after a COF connection area is cut into shape according to an embodiment of the present invention.

2. Because there is the specific height difference T between the OLED connection area 40 and the touch panel connection area 50, when being cut into shape, a bifurcated COF 30 needs to be slotted to provide a spacing D, as shown in FIG. 5, and is adapted to the height difference T between the touch panel connection area and the OLED connection area.

Figure 6:
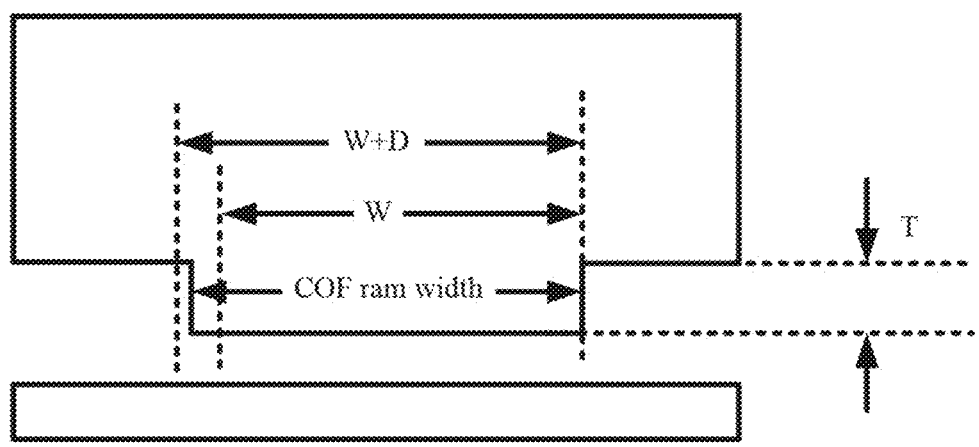
FIG. 6 is a schematic structural diagram of a COF connection area according to an embodiment of the present invention.

In this embodiment of the present invention, the COF connection area may be configured as a structure shown in FIG. 6, which is in a shape of an inverted convex structure.

In this embodiment of the present invention, the COF connection area 60 may also be referred to as a COF ram. A step height of such an inverted convex structure of the COF ram is T, which is kept consistent with the height difference T between the touch panel connection area 50 and the OLED panel connection area 40.

A middle boss height of the COF ram is greater than the width W of the OLED panel connection area, and less than a sum of the distance D between the touch panel connection area and the OLED panel connection area and the width W of the OLED panel connection area, that is, W<boss width<D+W.

Figure 7:
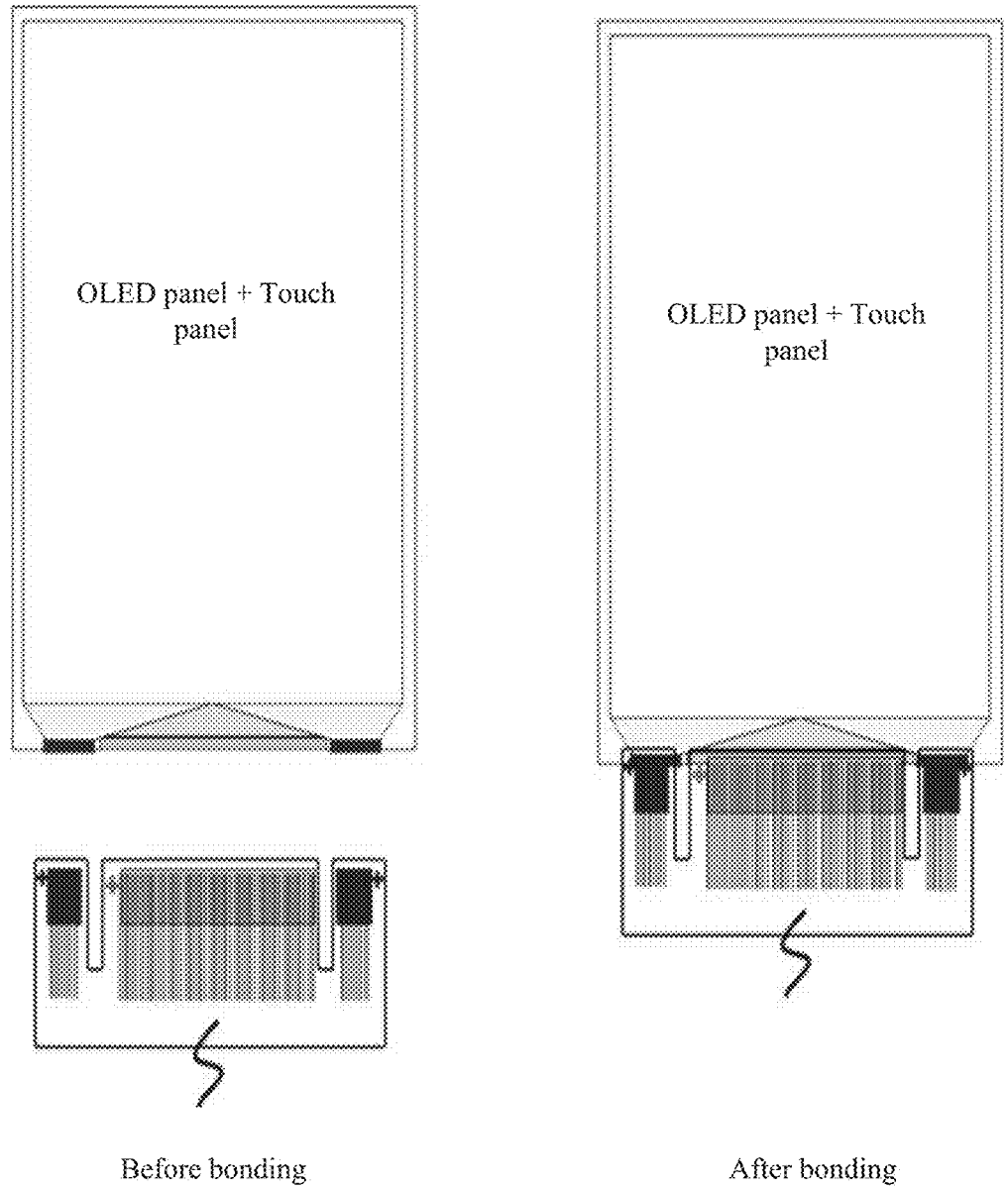
FIG. 7 is a schematic structural diagram before and after a COF connection area is bonded with a touch panel connection area and an OLED panel connection area according to an embodiment of the present invention.
Figure 8:
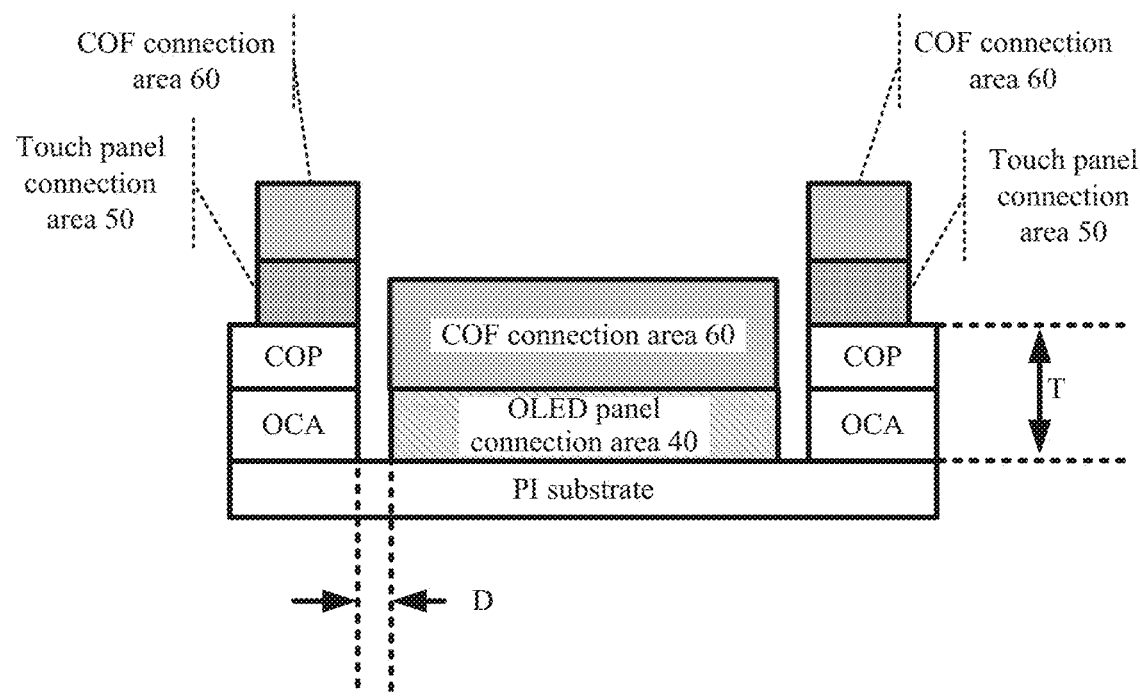
FIG. 8 is a schematic structural diagram of a cross section after a COF connection area is bonded with a touch panel connection area and an OLED panel connection area according to an embodiment of the present invention.

In this embodiment of the present invention, FIG. 7 is a schematic structural diagram before and after the COF connection area 60 is bonded with the OLED panel connection area 40 and the touch panel connection area 50. FIG. 8 is a schematic structural diagram of a cross section after the COF connection area 60 is bonded with the OLED panel connection area 40 and the touch panel connection area 50.

Figure 9:
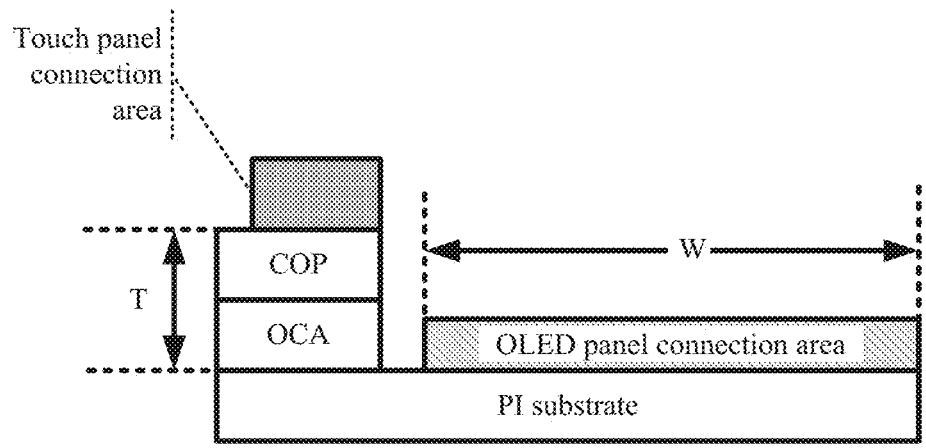
FIG. 9 is a schematic structural diagram of a cross section of an out-PIN side bezel of another display panel module according to an embodiment of the present invention.

In another embodiment of the present invention, a display panel module includes an organic light-emitting diode OLED panel, a touch panel, and a bifurcated chip on film COF. An OLED panel connection area is disposed at a first location on a first side of the OLED panel, and a touch panel connection area is disposed at a first location on a first side of the touch panel. One bifurcated terminal of a bifurcated end of the bifurcated COF is connected to the OLED panel connection area, and the other bifurcated terminal of the bifurcated end of the bifurcated COF is connected to the touch panel connection area. The other end of the bifurcated COF is connected to an FPC. The touch panel connection area may be disposed at one end side of an out-PIN side of the display panel module, and the OLED panel connection area is disposed at the other end side of the out-PIN side of the display panel module, as shown in FIG. 9. A cutting direction of a cross section shown in FIG. 9 is the same as the direction shown in FIG. 4B. Both the one end side and the other end side of the out-PIN side of the display panel module are located at the out-PIN side of the display panel module.

A width of the OLED panel connection area is still W. A value of W may be any value between 20 mm and 70 mm. The value of W may be determined based on factors such as a size of the OLED panel and/or a resolution of the OLED panel. A height difference between the touch panel connection area and the OLED panel connection area may still be T. The height difference T may be any value between 0.01 mm and 2 mm. A specific value of the height difference T may be determined based on factors such as a thickness of an OCA that bonds the OLED panel to the touch panel, and a thickness of another material that makes up a display panel. To avoid signal interference between the OLED panel and the touch panel, after the touch panel is bonded to the OLED panel, a distance D may still be kept between the touch panel connection area and the OLED panel connection area. A value of the distance D may be any value between 0.05 mm and 15 mm. The value of the distance D may be determined based on factors such as a size of the OLED panel and/or a resolution of the OLED panel.

Figure 10:
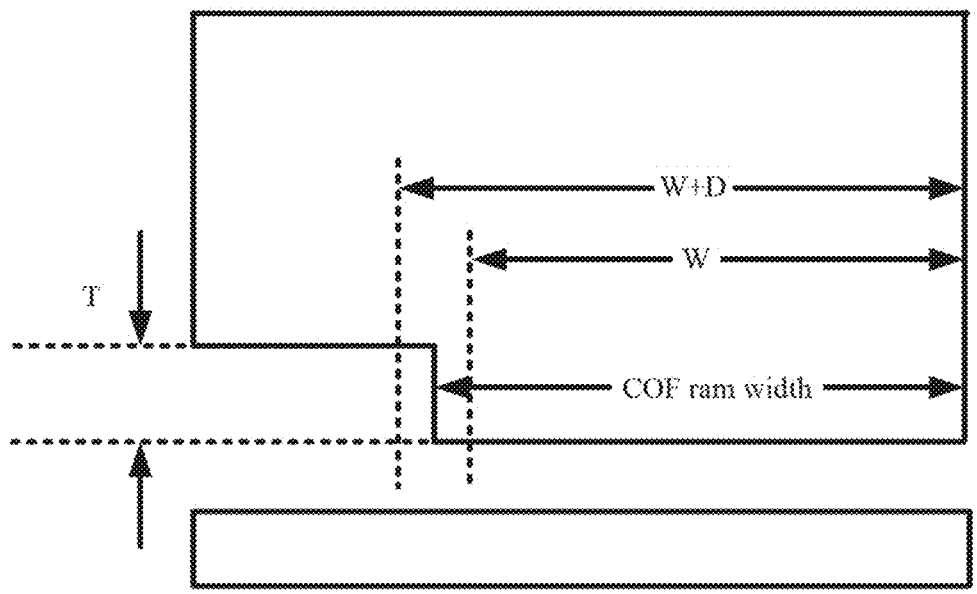
FIG. 10 is a schematic structural diagram of another COF connection area according to an embodiment of the present invention.

In an embodiment of the present invention, a COF connection area, namely, a COF ram, is shown in FIG. 10. A width of the COF ram is greater than a width W of an OLED panel connection area, and less than a sum of the width W of the OLED panel connection area and a distance D between the OLED panel connection area and a touch panel connection area, that is, W<COF ram width<W+D.

Figure 11:
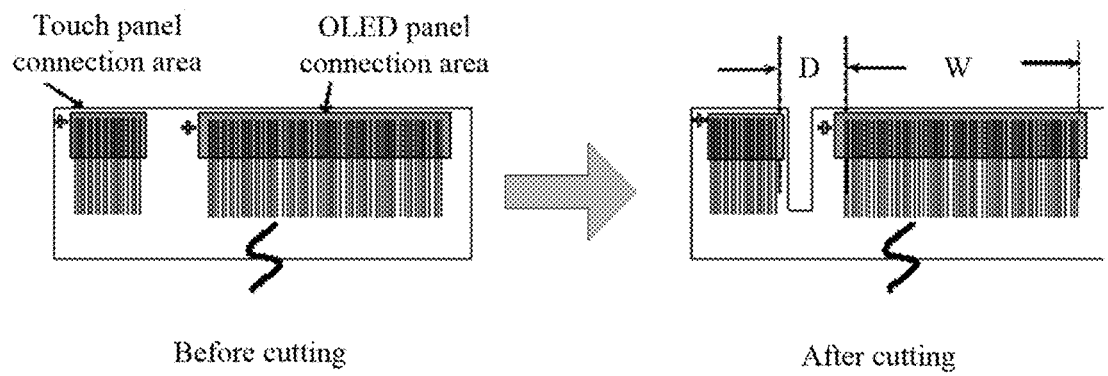
FIG. 11 is a schematic structural diagram before and after another COF connection area is cut into shape according to an embodiment of the present invention.

In addition, when being cut into shape, the COF connection area needs to be slotted to provide a spacing D, as shown in FIG. 11, and is adapted to a height difference T that originally exists between the touch panel connection area and the OLED connection area.

Figure 12:
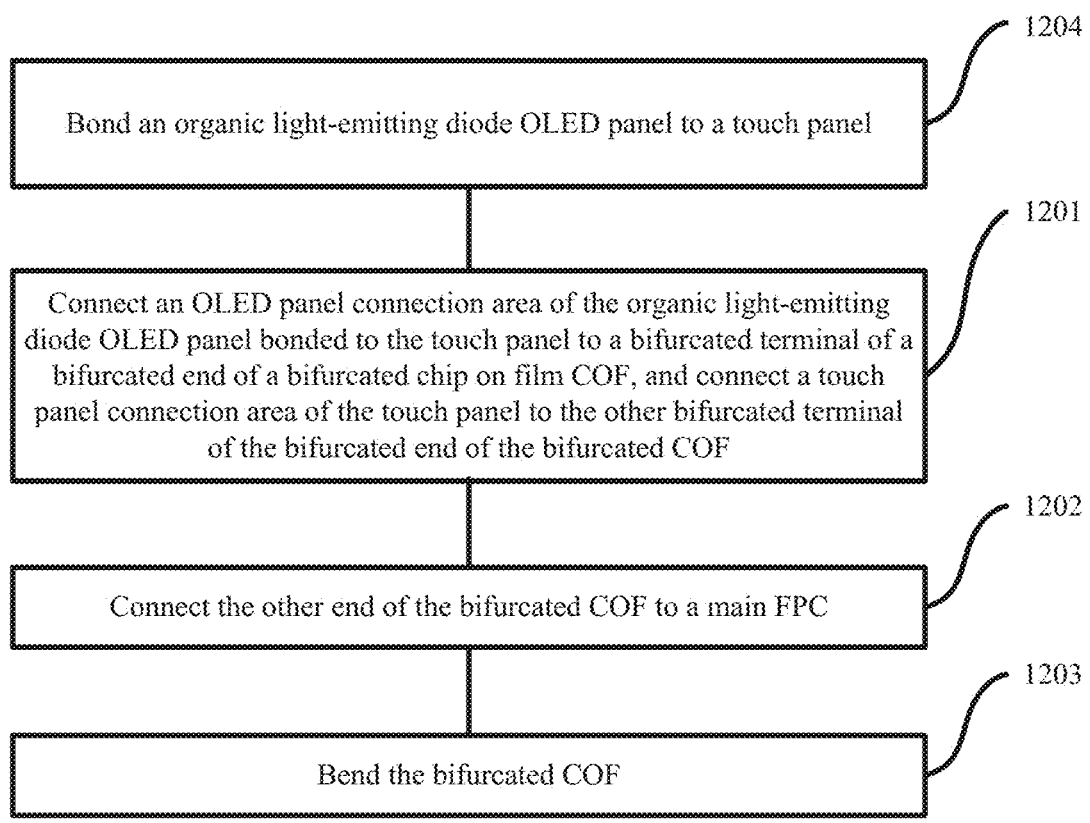
FIG. 12 is a schematic flowchart of a manufacturing method of a display panel module according to an embodiment of the present invention.

FIG. 12 is a schematic flowchart of a manufacturing method of a display panel module according to an embodiment of the present invention. As shown in FIG. 12, the method may include the following steps.

S1201. Connect an OLED panel connection area of an organic light-emitting diode OLED panel bonded to a touch panel to one bifurcated terminal of a bifurcated end of a bifurcated chip on film COF, and connect a touch panel connection area of the touch panel to the other bifurcated terminal of the bifurcated end of the bifurcated COF.

A chip of the bifurcated chip on film COF is a touch and display driver chip (touch and display driver integration, TDDI). The touch and display driver chip includes a touch driver and a display driver, and the touch driver and the display driver are integrated as one piece. In addition, the bifurcated chip on film COF may be an FPC to which the touch and display driver chip is bonded.

The OLED panel connection area disposed at a first location on a first side of the OLED panel is connected to the bifurcated terminal of the bifurcated end of the bifurcated COF, and the touch panel connection area disposed at a first location on a first side of the touch panel is connected to the other bifurcated terminal of the bifurcated end of the bifurcated COF. The first side of the OLED panel and the first side of the touch panel are a same side of the display panel module.

Optionally, in an embodiment of the present invention, as shown in FIG. 4A, the touch panel connection area may be disposed at two ends of an out-PIN side bezel, and the OLED panel connection area may be disposed at a middle location on the out-PIN side bezel.

Optionally, in another embodiment of the present invention, as shown in FIG. 9, the touch panel connection area may be disposed at one end of an out-PIN side bezel, and the OLED panel connection area may be disposed at the other end of the out-PIN side bezel.

In this embodiment of the present invention, the bifurcated end of the bifurcated COF may be referred to as a COF ram. A structure of the bifurcated end of the COF may be configured based on locations of the touch panel connection area and the OLED panel connection area, and may be specifically a structure shown in FIG. 6 or FIG. 10.

S1202. Connect the other end of the bifurcated COF to a main FPC.

S1203. Bend the bifurcated COF.

After the bifurcated COF is connected to the FPC, the bifurcated COF is bent. Using the bifurcated COF reduces a width of an out-PIN side bezel of the display panel module, thereby further improving user experience.

It should be noted that, in this embodiment of the present invention, S1201 and S1202 may be performed in any sequence. This is not limited in this embodiment of the present invention.

Optionally, before the connecting an OLED panel connection area of an organic light-emitting diode OLED panel bonded to a touch panel to one bifurcated terminal of a bifurcated end of a bifurcated chip on film COF, and connecting a touch panel connection area of the touch panel to the other bifurcated terminal of the bifurcated end of the bifurcated COF, the method further includes the following step:

S1204. Bond the organic light-emitting diode OLED panel to the touch panel.

In this embodiment of the present invention, the touch panel may be bonded to the OLED panel by using an OCA. The connection area of the bonded OLED panel is exposed through an opening area disposed on the touch panel, for example, the opening area 70 shown in FIG. 3B. To avoid signal interference between the OLED panel and the touch panel, after the OLED panel is bonded to the touch panel, a distance D may be kept between the touch panel connection area and the OLED panel connection area. A value of the distance D may be any value between 0.05 mm and 15 mm. The value of the distance D may be determined based on factors such as a size of the OLED panel and/or a resolution of the OLED panel.

Optionally, in this embodiment of the present invention, a width of the OLED panel connection area may be W. A value of W may be any value between 20 mm and 70 mm. Alternatively, the value of W may be determined based on factors such as a size of the OLED panel and/or a resolution of the OLED panel. There is a height difference T between the OLED panel connection area and the touch panel connection area. The height difference T may be any value between 0.01 mm and 2 mm. A specific value of the height difference T may be determined based on factors such as a thickness of an OCA that bonds the OLED panel to the touch panel, and a thickness of another material that makes up a display panel.

An embodiment of the present invention further provides an electronic device. The electronic device may include a display panel module and a processor described in any one of the foregoing embodiments.

The display panel module includes an organic light-emitting diode OLED panel, a touch panel, and a bifurcated chip on film COF. An OLED panel connection area is disposed at a first location on a first side of the OLED panel, and a touch panel connection area is disposed at a first location on a first side of the touch panel. The OLED panel connection area and the touch panel connection area are located at a same side of the display panel module. One bifurcated terminal of a bifurcated end of the bifurcated COF is connected to the OLED panel connection area, and the other bifurcated terminal of the bifurcated end of the bifurcated COF is connected to the touch panel connection area. The other end of the bifurcated COF is connected to the processor by using an FPC. A chip of the bifurcated chip on film COF is a touch and display driver chip.

Optionally, in an embodiment of the present invention, the first location on the first side of the OLED panel is a middle location on the OLED panel, and the first location on the first side of the touch panel is locations at two ends of the first side of the touch panel.

Optionally, in another embodiment of the present invention, the first location on the first side of the OLED panel and the first location on the first side of the touch panel are respectively at two ends of a first side of the display panel module.

Optionally, in an embodiment of the present invention, the OLED panel connection area is disposed at the first location on the first side of the OLED panel in a fan-like shape.

Optionally, a second location on the first side of the touch panel is disposed as an opening area, and a location of the OLED panel connection area is corresponding to the second location after the touch panel is bonded to the OLED panel, to expose the OLED panel connection area after the OLED panel is bonded to the touch panel.

Optionally, in an embodiment of the present invention, after the OLED panel is bonded to the touch panel, a distance D is kept between the OLED panel connection area and the touch panel connection area, and the distance D is any value between 0.05 mm and 15 mm.

Optionally, in an embodiment of the present invention, a width of the OLED panel connection area is W, and the width W is any value between 20 mm and 70 mm.

Optionally, in an embodiment of the present invention, there is a height difference T between the OLED panel connection area and the touch panel connection area, and the height difference T is any value between 0.01 mm and 2 mm.

Optionally, in an embodiment of the present invention, the bifurcated COF is a flexible circuit board FPC to which the touch and display driver chip is bonded.

For specific details about the display panel module provided in this embodiment of the present invention, refer to descriptions of FIG. 2 to FIG. 11. For brevity of description, details are not described herein again.

In this embodiment of the present invention, the electronic device is a mobile phone or a wearable device.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A display panel module, wherein the display panel module comprises an organic light-emitting diode OLED panel, a touch panel, and a bifurcated chip on film COF, wherein
an OLED panel connection area is disposed at a first location on a first side of the OLED panel, a touch panel connection area is disposed at a first location on a first side of the touch panel, and the OLED panel connection area and the touch panel connection area are located at a same side of the display panel module; one bifurcated terminal of a bifurcated end of the bifurcated COF is connected to the OLED panel connection area, and the other bifurcated terminal of the bifurcated end of the bifurcated COF is connected to the touch panel connection area; the other end of the bifurcated COF is connected to a main flexible printed circuit FPC; and a chip of the bifurcated chip on film COF is a touch and display driver chip.

2. The display panel module according to claim 1, wherein the first location on the first side of the OLED panel is a middle location on the first side of the OLED panel, and the first location on the first side of the touch panel is locations at two ends of the first side of the touch panel; or the first location on the first side of the OLED panel and the first location on the first side of the touch panel are respectively at two ends of a first side of the display panel module.

3. The display panel module according to claim 1 or 2, wherein the OLED panel connection area is disposed at the first location on the first side of the OLED panel in a fan-like shape.

4. The display panel module according to any one of claims 1 to 3, wherein a second location on the first side of the touch panel is disposed as an opening area, and a location of the OLED panel connection area is corresponding to the second location after the touch panel is bonded to the OLED panel, to expose the OLED panel connection area after the OLED panel is bonded to the touch panel.

5. The display panel module according to any one of claims 1 to 4, wherein after the OLED panel is bonded to the touch panel, a distance D is kept between the OLED panel connection area and the touch panel connection area, and the distance D is any value between 0.05 mm and 15 mm.

6. The display panel module according to any one of claims 1 to 5, wherein a width of the OLED panel connection area is W, and the width W is any value between 20 mm and 70 mm.

7. The display panel module according to any one of claims 1 to 6, wherein there is a height difference T between the OLED panel connection area and the touch panel connection area, and the height difference T is any value between 0.01 mm and 2 mm.

8. The display panel module according to any one of claims 1 to 7, wherein the bifurcated COF is a flexible circuit board to which the touch and display driver chip is bonded.

9. An electronic device, wherein the electronic device comprises a display panel module and a processor; the display panel module comprises an organic light-emitting diode OLED panel, a touch panel, and a bifurcated chip on film COF; an OLED panel connection area is disposed at a first location on a first side of the OLED panel, a touch panel connection area is disposed at a first location on a first side of the touch panel, and the OLED panel connection area and the touch panel connection area are located at a same side of the display panel module; one bifurcated terminal of a bifurcated end of the bifurcated COF is connected to the OLED panel connection area, and the other bifurcated terminal of the bifurcated end of the bifurcated COF is connected to the touch panel connection area; the other end of the bifurcated COF is connected to the processor by using a flexible circuit board; and a chip of the bifurcated chip on film COF is a touch and display driver chip.

10. The electronic device according to claim 9, wherein the first location on the first side of the OLED panel is a middle location on the first side of the OLED panel, and the first location on the first side of the touch panel is locations at two ends of the first side of the touch panel; or the first location on the first side of the OLED panel and the first location on the first side of the touch panel are respectively at two ends of a first side of the display panel module.

11. The electronic device according to claim 9 or 10, wherein the OLED panel connection area is disposed at the first location on the first side of the OLED panel in a fan-like shape.

12. The electronic device according to any one of claims 9 to 11, wherein a second location on the first side of the touch panel is disposed as an opening area, and a location of the OLED panel connection area is corresponding to the second location after the touch panel is bonded to the OLED panel, to expose the OLED panel connection area after the OLED panel is bonded to the touch panel.

13. The electronic device according to any one of claims 9 to 12, wherein after the OLED panel is bonded to the touch panel, a distance D is kept between the OLED panel connection area and the touch panel connection area and the distance D is any value between 0.05 mm and 15 mm.

14. The electronic device according to any one of claims 9 to 13, wherein a width of the OLED panel connection area is W, and the width WV is any value between 20 mm and 70 mm.

15. The electronic device according to any one of claims 9 to 14, wherein there is a height difference T between the OLED panel connection area and the touch panel connection area, and the height difference T is any value between 0.01 mm and 2 mm.

16. The electronic device according to any one of claims 9 to 15, wherein the bifurcated COF is a flexible circuit board FPC to which the touch and display driver chip is bonded.

17. The electronic device according to any one of claims 9 to 16, wherein the electronic device is a mobile phone or a wearable device.

* * * * *

UNITED STATES PATENT AND TRADEMARK OFFICE
CERTIFICATE OF CORRECTION

Page 1 of 1

PATENT NO. : 11,039,006 B2
APPLICATION NO. : 16/652474
DATED : June 15, 2021
INVENTOR(S) : Hu He It is certified that error appears in the above-identified patent and that said Letters Patent is hereby corrected as shown below:

In the Claims

Claim 13, Column 13, Line 4: "connection area and the" should read "connection area, and the"

Claim 14, Column 13, Line 14: "the width WV is any" should read "the width W is any"

Signed and Sealed this
Seventeenth Day of August, 2021

Drew Hirshfeld
*Performing the Functions and Duties of the
Under Secretary of Commerce for Intellectual Property and
Director of the United States Patent and Trademark Office*